United States Patent
Yoon

(10) Patent No.: US 10,163,464 B2
(45) Date of Patent: Dec. 25, 2018

(54) MEMORY MODULE CAPABLE OF MEASURING TEMPERATURE AND SYSTEM USING THE SAME

(71) Applicant: SK hynix Inc., Icheon-si, Gyeonggi-do (KR)

(72) Inventor: Hyun Ju Yoon, Suwon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/675,152

(22) Filed: Aug. 11, 2017

(65) Prior Publication Data

US 2018/0190330 A1  Jul. 5, 2018

(30) Foreign Application Priority Data

Jan. 5, 2017 (KR) .................. 10-2017-0001726

(51) Int. Cl.
| | |
|---|---|
| G11C 7/04 | (2006.01) |
| G11C 7/06 | (2006.01) |
| G11C 7/10 | (2006.01) |
| G11C 7/16 | (2006.01) |
| G11C 11/406 | (2006.01) |
| G11C 11/4091 | (2006.01) |
| G11C 11/4093 | (2006.01) |
| G11C 5/06 | (2006.01) |
| G11C 5/04 | (2006.01) |

(52) U.S. Cl.
CPC .............. *G11C 7/04* (2013.01); *G11C 5/04* (2013.01); *G11C 5/06* (2013.01); *G11C 7/06* (2013.01); *G11C 7/10* (2013.01); *G11C 7/16* (2013.01); *G11C 11/4091* (2013.01); *G11C 11/4093* (2013.01); *G11C 11/40626* (2013.01)

(58) Field of Classification Search
CPC .... G11C 7/04; G11C 5/04; G11C 5/06; G11C 7/06; G11C 7/10; G11C 7/16; G11C 11/40626; G11C 11/4091
USPC ....................... 365/212, 211, 233.13, 244
See application file for complete search history.

(56) References Cited

U.S. PATENT DOCUMENTS

| | | | | |
|---|---|---|---|---|
| 7,450,456 | B2 | 11/2008 | Jain et al. | |
| 9,530,513 | B1 * | 12/2016 | Pan | ......... G11C 16/32 |
| 2007/0211548 | A1 * | 9/2007 | Jain | ......... G11C 5/04 |
| | | | | 365/211 |
| 2015/0262708 | A1 * | 9/2015 | Lee | ......... H01L 25/18 |
| | | | | 365/191 |

* cited by examiner

*Primary Examiner* — Fernando Hidalgo
(74) *Attorney, Agent, or Firm* — William Park & Associates Ltd.

(57) ABSTRACT

A memory module may be provided. The memory module may include a thermocouple and a temperature sensor. The thermocouple may be coupled to at least one contact point among a plurality of contact points formed on a region, on which a memory device may be configured to be mounted. The temperature sensor may be coupled to the thermocouple, and may be configured to generate temperature information.

10 Claims, 5 Drawing Sheets

MEMORY MODULE CAPABLE OF MEASURING TEMPERATURE AND SYSTEM USING THE SAME

CROSS-REFERENCES TO RELATED APPLICATION

The present application claims priority under 35 U.S.C. § 119(a) to Korean application number 10-2017-0001726, filed on Jan. 5, 2017 in the Korean Intellectual Property Office, which is incorporated herein by reference in its entirety as set forth in full.

BACKGROUND

1. Technical Field

Various embodiments may generally relate to a semiconductor technology, and more particularly, to a memory module and a system using the same.

2. Related Art

An electronic device includes a lot of electronic elements, and a computer system includes lots of electronic elements comprising semiconductor apparatuses. The computer system as a representative electronic device includes a processor serving as a host and a memory serving as a data storage device. Particularly, a plurality of memories may be formed in a module, may be mounted in the memory system, and may serve as a temporary storage device. A representative module is a dual in-line memory module (DIMM). In general, a DIMM includes a plurality of DRAMs and performs data communication with the processor through the plurality of DRAMs. Since the DRAM includes a memory cell comprising a capacitor, the DRAM has characteristics relating to temperature sensitivity. Therefore, it is essential to measure the temperature of DRAM in the memory module to provide for the system's reliability.

SUMMARY

In an embodiment, a memory module may be provided. The memory module may include a module substrate including a region, on which a memory device may be configured to be mounted, wherein a plurality of contact points may be formed on the region. The memory module may include a thermocouple coupled to at least one contact point among the plurality of contact points. The memory module may include a temperature sensor coupled to the thermocouple, and may be configured to generate temperature information.

In an embodiment, a memory module may be provided. The memory module may include a module substrate including a plurality of regions, on which a plurality of memory devices may be configured to be mounted, wherein a plurality of contact points may be formed on each of the plurality of regions. The memory module may include a plurality of thermocouples coupled to at least one contact point among the plurality of contact points of the respective regions. The memory module may include a temperature sensor coupled to the plurality of thermocouples, and configured to generate a plurality of temperature information.

DETAILED DESCRIPTION

Hereinafter, a semiconductor apparatus according to an embodiment will be described below with reference to the accompanying drawings through various embodiments.

Figure 1:
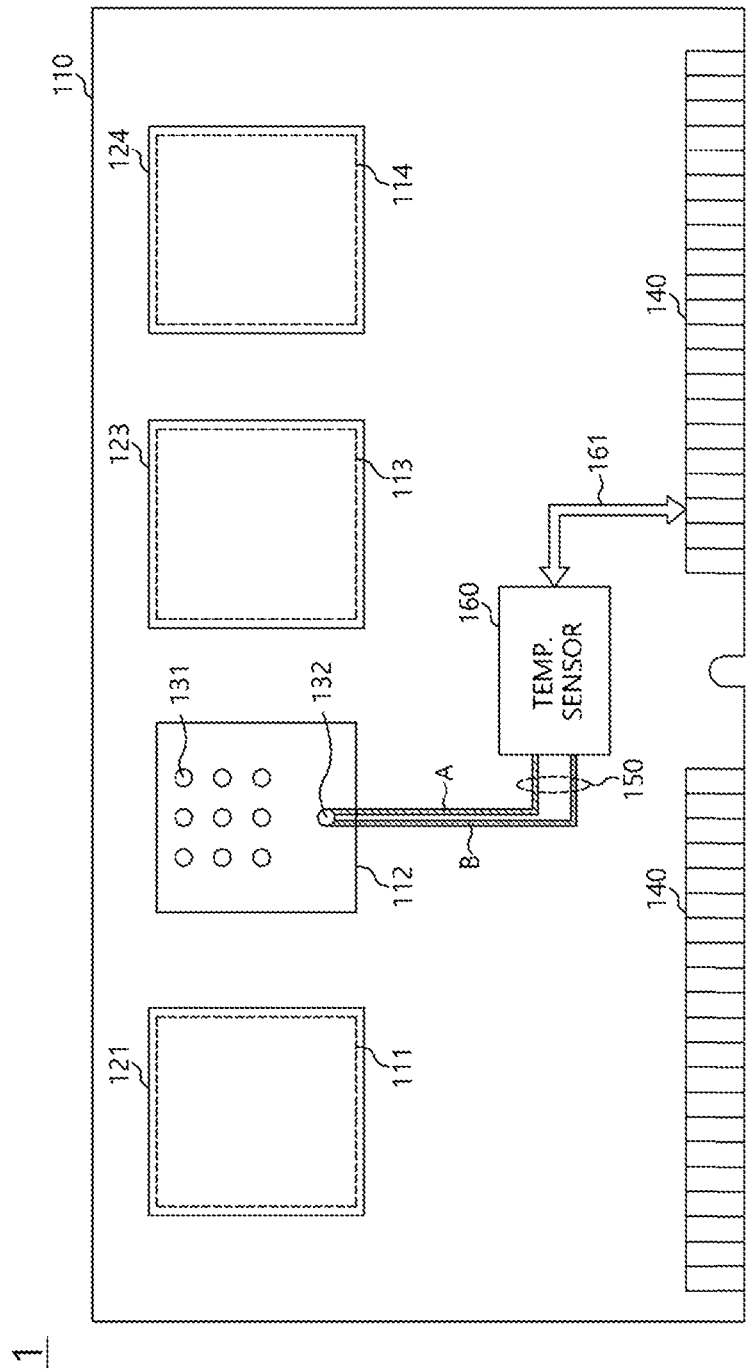
FIG. 1 is a diagram illustrating a representation of an example of a memory module in accordance with an embodiment.

FIG. 1 is a diagram illustrating a representation of an example of a memory module 1 in accordance with an embodiment. The memory module 1 may include a module substrate 110 and a plurality of memory devices 121, 123 and 124. The plurality of memory devices 121, 123 and 124 may be mounted on the module substrate 110. The plurality of memory devices 121, 123 and 124 may include one or more of volatile memories and nonvolatile memories. The volatile memories may include, for example but not limited to, the Static RAM (SRAM), the Dynamic RAM (DRAM) and the Synchronous DRAM (SDRAM). The nonvolatile memories may include, for example but not limited to, the Read Only Memory (ROM), the Programmable ROM (PROM), the Electrically Erase and Programmable ROM (EEPROM), the Electrically Programmable ROM (EPROM), the flash memory, the Phase change RAM (PRAM), the Magnetic RAM (MRAM), the Resistive RAM (RRAM), the Ferroelectric RAM (FRAM) and so forth.

The module substrate 110 may include a plurality of regions 111, 112, 113 and 114 on which the plurality of memory devices 121, 123 and 124 are mounted. Referring to FIG. 1, in order to describe the memory module 1 according to an embodiment, it is exemplified that the plurality of memory devices 121, 123 and 124 are mounted on some regions 111, 113 and 114 of the plurality of regions 111, 112, 113 and 114 while a memory device is not mounted on the region 112. A memory device may be mounted on the region 112. Each of the plurality of regions 111, 112, 113 and 114 may include a plurality of contact points 131 and 132 as illustrated in the region 112 of FIG. 1. Each of the plurality of contact points 131 and 132 may be a solder contact point. The contact point 131 may be coupled to the plurality of memory devices 121, 123 and 124 when the plurality of memory devices 121, 123 and 124 are mounted on the module substrate 110. Wires may be formed on the module substrate 110, and may be coupled to module pins 140. The module pins 140 may be channels or links through which the memory module 1 is coupled to an external device. The module pins 140 may be inserted into a slot provided on a mainboard (not illustrated). Therefore, the plurality of memory devices 121, 123 and 124 may be coupled to and may perform communication with an external device through the plurality of contact points 131 and 132, and the wires and the module pins 140 of the module substrate 110.

The memory module 1 may include a thermocouple 150 and a temperature sensor 160. The thermocouple 150 may include two metals, specific heats of which are different from each other. In an embodiment, for example, the thermocouple 150 may include two metals, each metal having a thermal conductivity different from the other. The thermocouple 150 may be formed on the module substrate 110. The module substrate 110 may include a first metal line A and a second metal line B. The first metal line A and the second metal line B may have different specific heats from each other. In an embodiment, for example, the first metal line A and the second metal line B may have different thermal conductivities from each other. For example, the first metal line A may be formed of, for example but not limited to, Copper (Cu) and the second metal line B may be formed of, for example but not limited to, Aluminium (Al), which will not limit the embodiments. Any metals having different specific heats from each other will do as the first metal line A and the second metal line B. In an embodiment, for example, any metals having different specific thermal conductivities from each other will do as the first metal line A and the second metal line B. The thermocouple 150 may be coupled to at least one of the plurality of contact points 131 and 132 formed on the plurality of regions 111, 112, 113 and 114, on which the plurality of memory devices 121, 123 and 124 are mounted. For example, the thermocouple 150 may be coupled to the contact point 132. The contact point 132 coupled to the thermocouple 150 may not be coupled to the memory device mounted on the region 112.

The temperature sensor 160 may be coupled to the thermocouple 150. The temperature sensor 160 may generate temperature information according to the connection to the thermocouple 150. For example, the temperature sensor 160 may include a cold junction or a reference junction, and may sense a difference in thermal conductivities of the thermocouple 150. The temperature sensor 160 may generate the temperature information by sensing current or voltage induced by difference of the thermal conductivities of the thermocouple 150. As will be described later, the temperature sensor 160 may include an analogue-to-digital converter, generate a digital code signal from the sensed current or voltage, and may provide the digital code signal as the temperature information.

The temperature sensor 160 may be coupled to the module pins 140 through a temperature bus 161. The temperature bus 161 may be one of the wires formed on the module substrate 110. The temperature sensor 160 may be coupled to an external device (not illustrated) through the temperature bus 161. The external device may be a memory controller or a host in communication with the memory module 1. The temperature sensor 160 may measure temperature of the memory module 1 and the plurality of memory devices 121, 123 and 124 according to the connection to the external device. For example, the temperature sensor 160 may generate the temperature information and may provide the temperature information to the external device in response to a command provided from the external device.

As described above, the plurality of memory devices 121, 123 and 124 may be mounted on the plurality of regions 111, 112, 113 and 114, respectively. Therefore, temperature of the contact points, which are formed under the plurality of memory devices 121, 123 and 124 although the contact points are not coupled to the plurality of memory devices 121, 123 and 124, may change according to the temperature of the plurality of memory devices 121, 123 and 124. Therefore, it may be possible to measure the temperature of the plurality of memory devices 121, 123 and 124 through the thermocouple 150 coupled to the contact point and the temperature sensor 160 coupled to the thermocouple 150.

The memory module 1 may be implemented in one of modules including, for example but not limited to, Unbuffered Dual In-line Memory Module (UDIMM), Dual Inline Memory Module (DIMM), Registered Dual In-line Memory Module (RDIMM), Load Reduced Dual In-line Memory Module (LRDIMM), Small Outline Dual In-line Memory Module (SODIMM) and Non-Volatile Dual In-line Memory Module (NVDIMM). The memory module 110 may be one including the advanced memory buffer capable of performing substantially similar operations to a memory controller or a host.

Figure 2:
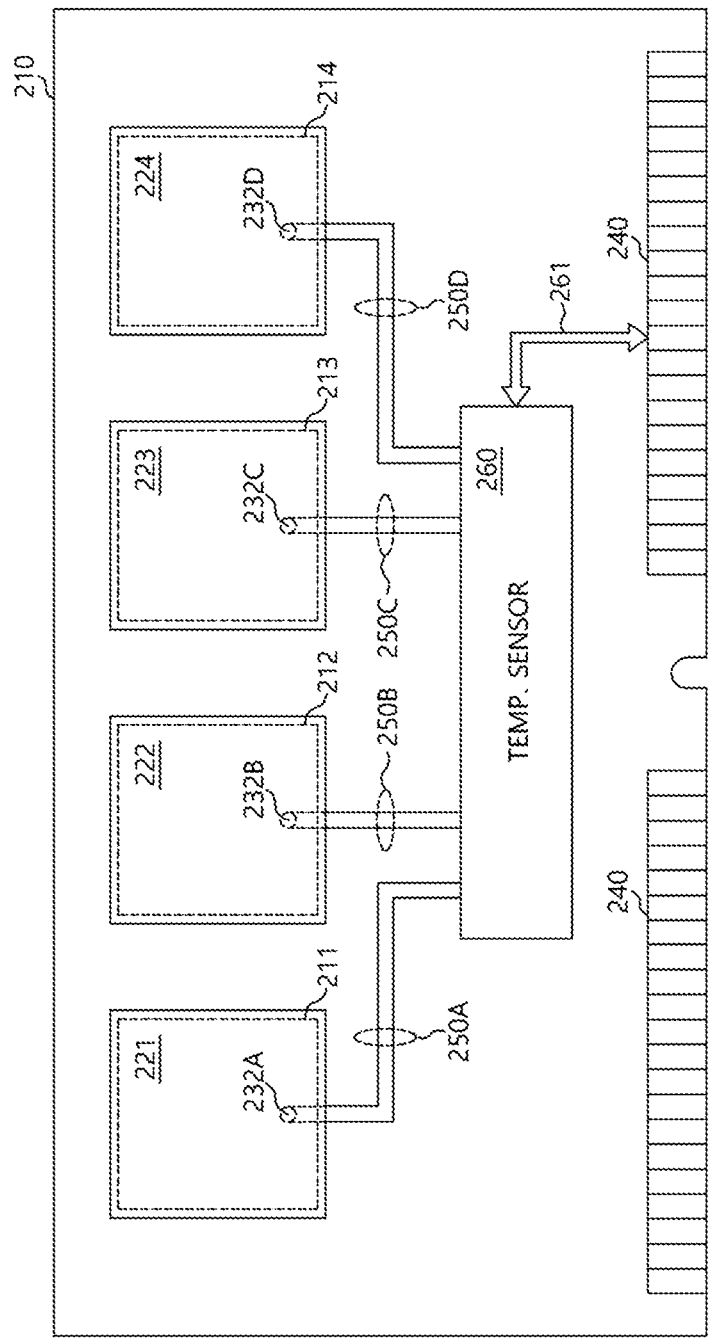
FIG. 2 is a diagram illustrating a representation of an example of a memory module in accordance with an embodiment.

FIG. 2 is a diagram illustrating a representation of an example of a memory module 2 in accordance with an embodiment. Referring to FIG. 2, the memory module 2 may include a module substrate 210, a plurality of memory devices 221, 222, 223 and 224 and a temperature sensor 260. The module substrate 210 may include a plurality of regions 211, 212, 213 and 214 on which the plurality of memory devices 221, 222, 223 and 224 are mounted. Each of the plurality of regions 211, 212, 213 and 214 may include a plurality of contact points, which is similar to the plurality of regions 111, 112, 113 and 114 described with reference to FIG. 1. Among the plurality of contact points formed on the plurality of regions 211, 212, 213 and 214, one or more contact points 232A, 232B, 232C and 232D may be coupled to a plurality of thermocouples 250A, 250B, 250C and 250D, respectively. The plurality of thermocouples 250A, 250B, 250C and 250D may be formed on the module substrate 210. For example, a single contact point 232A formed on the first region 211, on which the first memory device 221 is mounted, may be coupled to the first thermocouple 250A. For example, a single contact point 232B formed on the second region 212, on which the second memory device 222 is mounted, may be coupled to the second thermocouple 250B. For example, a single contact point 232C formed on the third region 213, on which the third memory device 223 is mounted, may be coupled to the third thermocouple 250C. For example, a single contact point 232D formed on the fourth region 214, on which the fourth memory device 224 is mounted, may be coupled to the fourth thermocouple 250D.

The temperature sensor 260 may be coupled to the plurality of thermocouples 250A, 250B, 250C and 250D. The temperature sensor 260 may be sequentially coupled to the plurality of thermocouples 250A, 250B, 250C and 250D, and may generate a plurality of temperature information. The temperature sensor 260 may output the plurality of temperature information at the same time or sequentially. The temperature sensor 260 may be coupled to the first to fourth thermocouples 250A, 250B, 250C and 250D, and may generate temperature information of the respective first to fourth memory devices 221, 222, 223 and 224. The temperature sensor 260 may be sequentially coupled to the first to fourth thermocouples 250A, 250B, 250C and 250D. The temperature sensor 260 may be sequentially coupled to the first to fourth thermocouples 250A, 250B, 250C and 250D, and may sequentially generate temperature information of the respective first to fourth memory devices 221, 222, 223 and 224. The temperature sensor 260 may be coupled to a temperature bus 261. The temperature bus 261 may be coupled to an external device (not illustrated) through module pins 240. The temperature sensor 260 may sequentially generate the temperature information of the plurality of memory devices 221, 222, 223 and 224 and may provide the sequentially generated temperature information to the external device at the same time or sequentially in response to a command provided from the external device.

Figure 3:
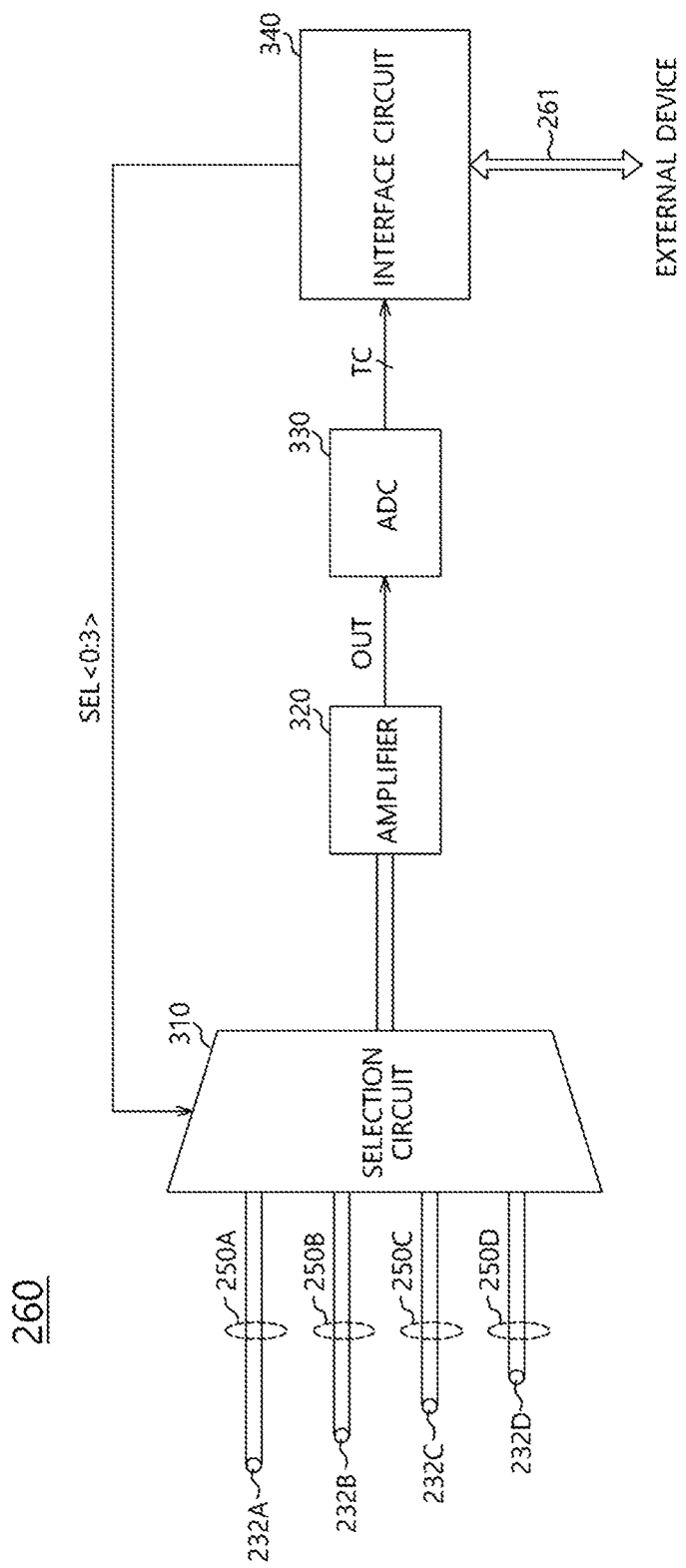
FIG. 3 is a diagram illustrating a representation of an example of a temperature sensor of FIG. 2.

FIG. 3 is a diagram illustrating a representation of an example of the temperature sensor 260 of FIG. 2. Referring to FIG. 3, the temperature sensor 260 may include a selection circuit 310, an amplifier 320, an analogue-to-digital converter (ADC) 330 and an interface circuit 340. The selection circuit 310 may be coupled to the plurality of thermocouples 250A, 250B, 250C and 250D, and may be selectively coupled to the plurality of thermocouples 250A, 250B, 250C and 250D according to a selection signal SEL<0:3>. For example, the selection circuit 310 may be implemented with a multiplexer, which is coupled to one among the first to fourth thermocouples 250A, 250B, 250C and 250D according to the selection signal SEL<0:3>. The amplifier 320 may be coupled to an output node of the selection circuit 310. The amplifier 320 may detect difference of thermal conductivities of a thermocouple selected by the selection circuit 310. The amplifier 320 may generate an amplification signal OUT by detecting voltage or current running through the thermocouple selected by the selection circuit 310. The amplifier 320 may induce voltage or current running through the thermocouple coupled through the selection circuit 310 by providing a cold junction or a reference junction, and may amplify the induced current or voltage. Structure and operation of the amplifier 320 may be implemented with any known art.

The analogue-to-digital converter 330 may be coupled to the amplifier 320 and may receive an output of the amplifier 320. The analogue-to-digital converter 330 may generate a digital code signal TC by converting the analogue amplification signal OUT into a digital signal. The digital code signal TC may be provided as the temperature information. The interface circuit 340 may be coupled to an external device through the temperature bus 261. The interface circuit 340 may receive a command signal provided from the external device. The interface circuit 340 may generate the selection signal SEL<0:3> in response to the command signal. For example, the interface circuit 340 may sequentially enable the selection signal SEL<0:3> at a predetermined time interval in response to the command signal. Also, the interface circuit 340 may receive as the temperature information the digital code signal TC generated by the analogue-to-digital converter 330. The interface circuit 340 may output the temperature information to the external device through the temperature bus 261.

Hereinafter, a method of measuring temperature of the memory module 2 and a memory device in accordance with an embodiment will be described with reference to FIGS. 2 and 3. In order to obtain the temperature information of the memory module 2 and the plurality of memory devices 221, 222, 223 and 224 mounted on the memory module 2, an external device may provide a command signal to the temperature sensor 260. The interface circuit 340 may generate the selection signal SEL<0:3> in response to the command signal. The selection circuit 310 may sequentially couple the first to fourth thermocouples 250A, 250B, 250C and 250D to the amplifier 320 in response to the selection signal SEL<0:3>. The amplifier 320 and the analogue-to-digital converter 330 may sequentially generate a plurality of digital code signals TC corresponding to voltage or current running through the first to fourth thermocouples 250A, 250B, 250C and 250D. The interface circuit 340 may receive the plurality of digital code signals TC, and may output as the temperature information the plurality of digital code signals TC to the external device at the same time or sequentially. Therefore, the external device may easily monitor the temperature of the respective first to fourth memory devices 221, 222, 223 and 224.

Figure 4:
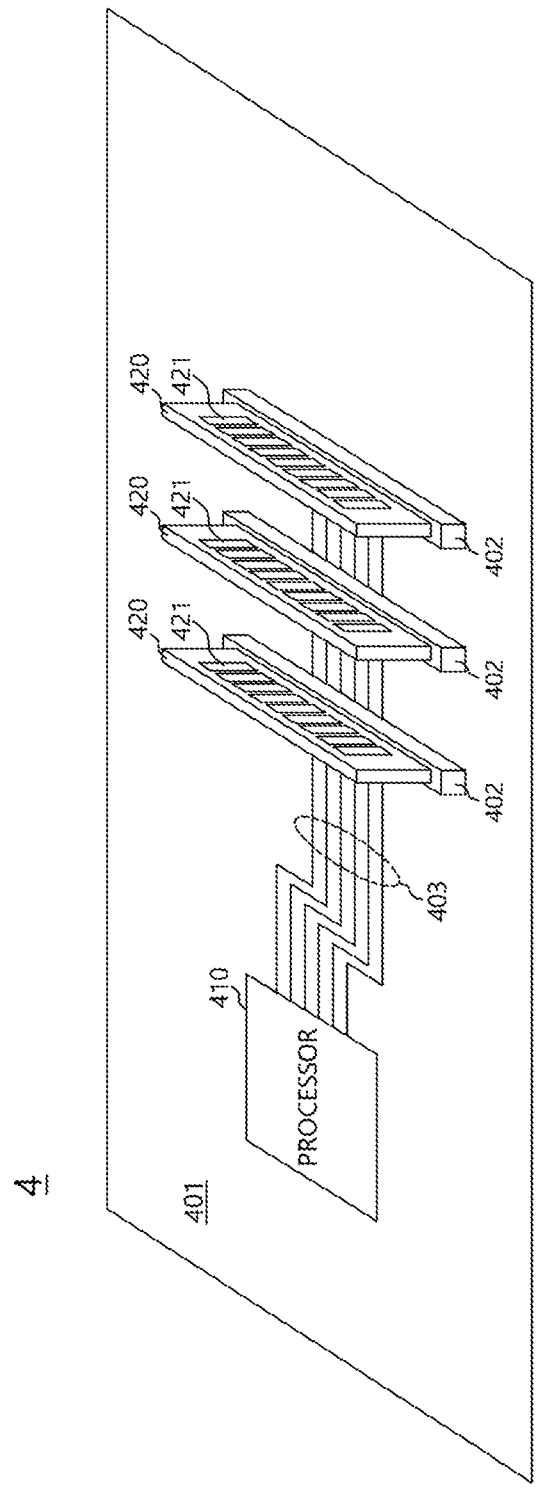
FIG. 4 is a diagram illustrating a representation of an example of a system in accordance with an embodiment.

FIG. 4 is a diagram illustrating a representation of an example of a system 4 in accordance with an embodiment. The system 4 may include a main board 401, a processor 410, and a memory module 420. The main board 401 may be a substrate, on which elements for the system 4 are mounted, and may be referred to as the Mother Board. The main board 401 may include a slot (not illustrated), on which the processor 410 is mounted, and a slot 402, on which the memory module 420 is mounted. The main board 401 may include wires 403 for electrically coupling the processor 410 and the memory module 420. The processor 410 may be mounted on the main board 401. The processor 410 may include one or more among the central processing unit (CPU), the graphic processing unit (GPU), the multi-media processor (MMP) and the digital signal processor. The processor 410 may be implemented in a form of the system on chip (SoC) by combining processor chips having various functions such as the application processor (AP).

The memory module 420 may be mounted on the main board 401 through the slot 402 of the main board 401. The memory module 420 may be coupled to the wires 403 of the main board 401 through the slot 402 and a module pin formed on a module substrate. For example, the memory module 420 may include Unbuffered Dual In-line Memory Module (UDIMM), Dual Inline Memory Module (DIMM), Registered Dual In-line Memory Module (RDIMM), Load Reduced Dual In-line Memory Module (LRDIMM), Small Outline Dual In-line Memory Module (SODIMM) and Non-Volatile Dual In-line Memory Module (NVDIMM) and so forth. Each of the memory modules 1 and 2 respectively described with reference to FIGS. 1 and 2 may be applied as the memory module 420. The memory module 420 may include a plurality of memory devices 421. The plurality of memory devices 421 may include one or more of a volatile memory and a nonvolatile memory device. The volatile memories may include the Static RAM (SRAM), the Dynamic RAM (DRAM) and the Synchronous DRAM (SDRAM). The nonvolatile memories may include the Read Only Memory (ROM), the Programmable ROM (PROM), the Electrically Erase and Programmable ROM (EEPROM), the Electrically Programmable ROM (EPROM), the flash memory, the Phase change RAM (PRAM), the Magnetic RAM (MRAM), the Resistive RAM (RRAM), the Ferroelectric RAM (FRAM) and so forth. The plurality of memory devices 421 may include a stacked memory device, which is formed by stacking a plurality of chips, or a multi-chip package.

Figure 5:
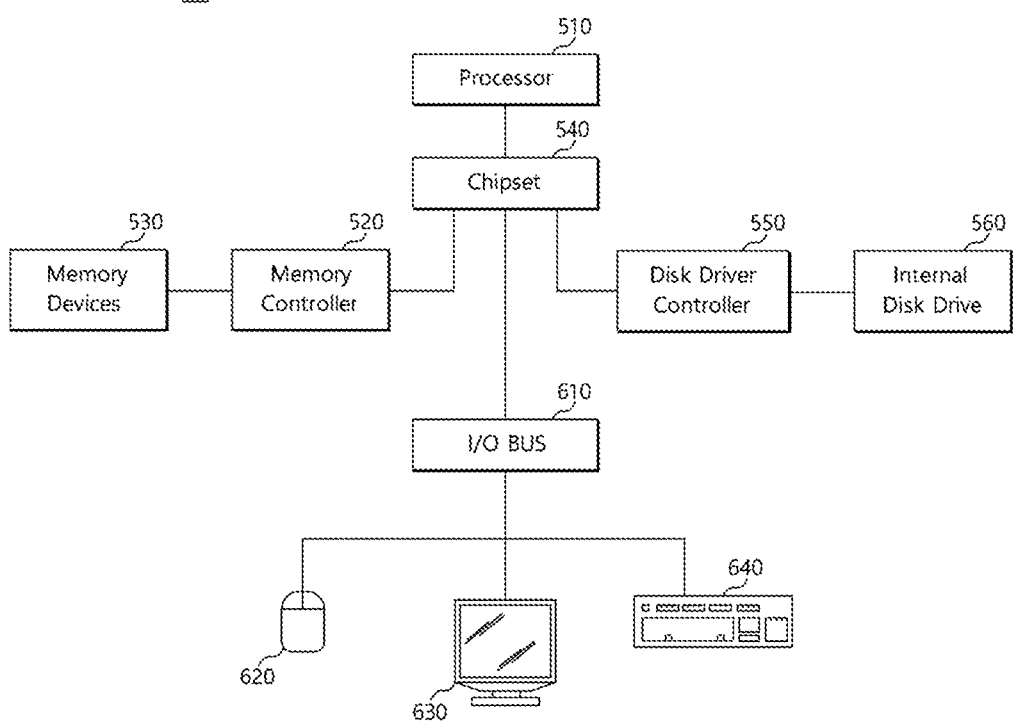
FIG. 5 is a diagram illustrating a representation of an example of a system in accordance with an embodiment.

FIG. 5 is a diagram illustrating a representation of an example of a system 5 in accordance with an embodiment. Referring to FIG. 5, the system 5 may include a processor 510, a memory controller 520 and memory devices 530. The processor 510 may be coupled to the memory controller 520 through a chipset 540, and the memory controller 520 may be coupled to the memory device 530 through a plurality of buses. Although FIG. 5 exemplifies a single processor 510, which will not limit the embodiment, a plurality of processors may be physically or logically provided. The chipset 540 may provide a communication path transferring a signal between the processor 510 and the memory controller 520. The processor 510 may perform an arithmetic operation, and may provide a request and data to the memory controller 520 through the chipset 540 for the input and output (input/output) of intended data.

The memory controller 520 may transmit a command signal, an address signal, a clock signal and data through the plurality of buses. The memory device 530 may receive the signals provided from the memory controller 520, may store data and may output stored data to the memory controller 520. The memory device 530 may include a plurality of memory modules, and may adopt the memory modules 1 and 2 respectively described with reference to FIGS. 1 and 2.

Referring to FIG. 5, the system 5 may further include an input/output bus 610, input/output devices 620, 630 and 640, a disk driver controller 550 and an internal disk drive 560. The chipset 540 may be coupled to the input/output bus 610. The input/output bus 610 may provide communication paths for transferring signals between the chipset 540 and the input/output devices 620, 630 and 640. The input/output devices 620, 630 and 640 may include, for example but not limited to, a mouse 620, a video player 630 or a keyboard 640. The input/output bus 610 may include any communication protocol capable of communicating with the input/output devices 620, 630 and 640. Further, the input/output bus 610 may be integrated inside the chipset 540.

The disk driver controller 550 may perform operations in connection to the chipset 540. The disk driver controller 550 may provide communication paths between the chipset 540 and one or more of the internal disk drives 560. The internal disk drive 560 may serve as an external data storage device by storing a command and data. The disk driver controller 550 and the internal disk drive 560 may perform communication with each other or with the chipset 540 by using any communication protocol including the input/output bus 610.

While certain embodiments have been described above, it will be understood to those skilled in the art that the embodiments described are by way of example only. Accordingly, the memory modules capable of measuring temperature and system using the same should not be limited based on the described embodiments. Rather, the memory modules capable of measuring temperature and system using the same described herein should only be limited in light of the claims that follow when taken in conjunction with the above description and accompanying drawings.

What is claimed is:

1. A memory module comprising:
a module substrate including a region, on which a memory device is configured to be mounted, wherein a plurality of contact points are formed on the region;
a thermocouple coupled to at least one contact point among the plurality of contact points; and
a temperature sensor coupled to the thermocouple, and configured to generate temperature information,
wherein the memory device is mounted to the region through at least one contact point from the plurality of contact points,
wherein the at least one contact point coupled to the thermocouple is not coupled to the memory device, and
wherein the thermocouple is mounted on the substrate outside the memory device.

2. The memory module of claim 1, wherein the thermocouple is formed of two different metals, specific heats of which are different from each other.

3. The memory module of claim 1, wherein the thermocouple is formed of two different metals, each of the metals having a thermal conductivity different from the other.

4. The memory module of claim 2, wherein the temperature sensor generates temperature information by sensing a difference between thermal conductivities of the two metals.

5. A memory module comprising:
a module substrate including a plurality of regions, on which a plurality of memory devices are configured to be mounted, wherein a plurality of contact points are formed on each of the plurality of regions;
a plurality of thermocouples coupled to at least one contact point among the plurality of contact points of the respective regions; and
a temperature sensor coupled to the plurality of thermocouples, and configured to generate a plurality of temperature information,
wherein the plurality of memory devices are respectively mounted to the region through at least one contact point from the plurality of contact points formed in each of the plurality of regions,
wherein, in each of the plurality of regions, the at least one contact point coupled to the plurality of thermocouples is not coupled to the plurality of memory devices, and
wherein the plurality of thermocouples are mounted on the substrate outside the plurality of memory devices.

6. The memory module of claim 5, wherein each of the plurality of thermocouples is formed of two different metals, specific heats of which are different from each other.

7. The memory module of claim 5, wherein each of the plurality of thermocouples is formed of two different metals, each of the two different metals having a thermal conductivity different from the other.

8. The memory module of claim 5, wherein the temperature sensor generates temperature information by sensing a difference between thermal conductivities of the two metals.

9. The memory module of claim 5, wherein the temperature sensor includes:
a selection circuit configured to be selectively coupled to the plurality of thermocouples according to a selection signal;
an amplifier configured to sense difference between thermal conductivities of a thermocouple coupled to the selection circuit;
an analogue-to-digital converter configured to convert an output of the amplifier into digital temperature information; and
an interface circuit configured to generate the selection signal, and to output the digital temperature information to an external device based on a command signal provided from the external device.

10. The memory module of claim 5, wherein the temperature sensor includes:
a selection circuit configured to be selectively coupled to the plurality of thermocouples according to a selection signal;
an amplifier configured to sense difference between thermal conductivities of a thermocouple coupled to the selection circuit;
an analogue-to-digital converter configured to convert an output of the amplifier into digital temperature information; and
an interface circuit configured to generate the selection signal, and to output the digital temperature information through a temperature bus to module pin based on a command signal received from the temperature bus.

* * * * *